(12) United States Patent
Song et al.

(10) Patent No.: US 8,186,562 B1
(45) Date of Patent: May 29, 2012

(54) APPARATUS FOR INCREASING COVERAGE OF SHIELDING GAS DURING WIRE BONDING

(75) Inventors: Keng Yew James Song, Singapore (SG); Ka Shing Kenny Kwan, Singapore (SG); Boon June Yeap, Singapore (SG); Shi Jie Chen, Singapore (SG); Sathish Kumar Balakrishnan, Singapore (SG); Kumaresh Govindan Radhakrishnan, Singapore (SG)

(73) Assignee: ASM Technology Singapore PTE Ltd, Singapore (SG)

( * ) Notice: Subject to any disclaimer, the term of this patent is extended or adjusted under 35 U.S.C. 154(b) by 0 days.

(21) Appl. No.: 12/967,243

(22) Filed: Dec. 14, 2010

(51) Int. Cl.
*B23K 37/00* (2006.01)
*B23K 31/02* (2006.01)

(52) U.S. Cl. ......... 228/4.5; 228/42; 228/180.5; 228/219
(58) Field of Classification Search .................. None
See application file for complete search history.

(56) References Cited

U.S. PATENT DOCUMENTS

| | | | | |
|---|---|---|---|---|
| 4,909,427 A * | 3/1990 | Plaisted et al. | | 228/4.5 |
| 6,180,891 B1 * | 1/2001 | Murdeshwar | | 174/260 |
| 6,234,376 B1 | 5/2001 | Wicen | | |
| 6,824,037 B2 * | 11/2004 | Sakai et al. | | 228/4.5 |
| 7,614,538 B2 * | 11/2009 | Gillotti et al. | | 228/4.5 |
| 7,628,307 B2 | 12/2009 | Wong et al. | | |
| 7,644,852 B2 * | 1/2010 | Nishiura et al. | | 228/9 |
| 2004/0065720 A1 * | 4/2004 | Wong et al. | | 228/219 |
| 2007/0284421 A1 * | 12/2007 | Gillotti et al. | | 228/212 |
| 2008/0000950 A1 * | 1/2008 | Nishiura et al. | | 228/180.5 |
| 2008/0035709 A1 * | 2/2008 | Nishiura et al. | | 228/176 |
| 2008/0099531 A1 * | 5/2008 | Wong et al. | | 228/4.5 |
| 2009/0134201 A1 * | 5/2009 | Jindo et al. | | 228/42 |
| 2010/0078464 A1 * | 4/2010 | Nishiura | | 228/220 |
| 2010/0230476 A1 * | 9/2010 | Gillotti et al. | | 228/180.5 |
| 2011/0049219 A1 * | 3/2011 | Huang et al. | | 228/42 |
| 2011/0073635 A1 * | 3/2011 | Gillotti et al. | | 228/4.5 |

FOREIGN PATENT DOCUMENTS

| | | | |
|---|---|---|---|
| JP | 57-154850 A | * | 9/1982 |
| JP | 59-182533 A | * | 10/1984 |
| JP | 60-054446 A | * | 3/1985 |
| JP | 60-059744 A | * | 4/1985 |
| JP | 02-288345 A | * | 11/1990 |
| JP | 05-226401 A | * | 9/1993 |
| JP | 60-244034 A | * | 3/1996 |

* cited by examiner

*Primary Examiner* — Kiley Stoner
(74) *Attorney, Agent, or Firm* — Ostrolenk Faber LLP (57) ABSTRACT

A main body of an apparatus for delivering shielding gas during wire bonding of an electronic device has a through-hole in the main body which is sized for allowing a capillary tip of a bonding tool to be insertable through the main body when performing wire bonding. At least one gas outlet located on a bottom surface of the main body adjacent to the through-hole is operative to direct an inert gas in a direction towards the electronic device. At least one gas inlet in the main body is operative to supply the inert gas to the through-hole and to the gas outlet.

17 Claims, 6 Drawing Sheets

APPARATUS FOR INCREASING COVERAGE OF SHIELDING GAS DURING WIRE BONDING

FIELD OF THE INVENTION

The invention relates to the forming of electrical connections on electronic components, and in particular to the connection of wires to electronic components during wire bonding.

BACKGROUND AND PRIOR ART

Wire bonding is used to connect electrical contact points of different devices, or different electrical contact points of the same device. When bonding wires made of reactive materials such as copper or aluminum are used for wire bonding, there is a tendency for oxidation of the wire to occur when the heated material reacts with oxygen in the atmosphere. Oxidation of the wire decreases the quality of the subsequent wire bonds that are formed. Therefore, it is necessary to provide a shielding gas comprised of a relatively inert gas such as nitrogen, hydrogen or argon gas to cover and protect the wire during ball formation of a wire ball-bonding process.

The continuing emphasis on better shielding of copper wire during bonding by providing nitrogen and/or hydrogen gas to shield the wire is driving the development of systems that ensure that the gas is captured within the sparking region of the wire, where a molten ball is formed from the wire for copper ball bonding.

An apparatus for containing shielding gas when supplying the inert gas to bonding wire is disclosed in U.S. Pat. No. 6,234,376 entitled "Supplying a Cover Gas for Wire Ball Bonding". The apparatus includes a gas-containment tube to direct shielding gas to the bonding wire. Transverse in-line orifices are made in the tube to allow the capillary of the bonding tool to enter the gas-containing tube for ball formation, and then to pass through the tube to bond the ball onto a bonding surface.

Another prior art apparatus for containing shield gas is disclosed in U.S. Pat. No. 7,628,307 entitled "Apparatus for Delivering Shielding Gas During Wire Bonding". Shielding gas is supplied during the bonding of wires to electronic components by way of an apparatus comprising a main body with an elongated slot having a width that extends into the main body from a side of the main body generally in a first direction, and the slot also extends from a top surface to a bottom surface of the main body in a second direction perpendicular to the first direction for the width of the slot. A tip of the capillary is operable to pass through the slot in the second direction while a gas outlet supplies shielding gas into the slot.

A shortcoming of conventional approaches to deliver shielding gas to the capillary is that prior art systems focus on preventing the wire from native oxidation mainly during the sparking of the wire to form a molten ball. There is loss of gas at the openings of the tubes or apparatus such that oxidation protection is not possible outside these openings. Thus, they do not effectively provide gas coverage to prevent oxidation when wire bonding is being performed, or when moving the capillary sideways to various locations unless the capillary is always located inside the gas containment tube during such movement. This limits the versatility of such systems.

It would therefore be desirable to develop an apparatus for supplying shielding gas to a bonding wire that ensures that the wire is protected by shielding gas not only within the sparking range but also along the travelling path of the capillary to the bonding pad, and thus ensuring the quality of the molten ball both before and during bonding of the same is achieved.

SUMMARY OF THE INVENTION

It is thus an object of the invention to seek to provide improved gas coverage to bonding wire in order to prevent oxidation of the wire not only during sparking, but also during movement of the capillary and in particular during bonding.

Accordingly, the invention provides an apparatus for delivering shielding gas during wire bonding of an electronic device, comprising: a main body; a through-hole in the main body which is sized for allowing a capillary tip of a bonding tool to be insertable through the main body when performing wire bonding; at least one gas outlet on a bottom surface of the main body and located adjacent to the through-hole, the gas outlet being operative to direct an inert gas in a direction towards the electronic device; and at least one gas inlet in the main body operative to supply the inert gas to the through-hole and the gas outlet.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of preferred embodiments of a gas supplying apparatus in accordance with the invention will now be described with reference to the accompanying drawings, in which.

DETAILED DESCRIPTION OF THE PREFERRED EMBODIMENT OF THE INVENTION

Figure 1:
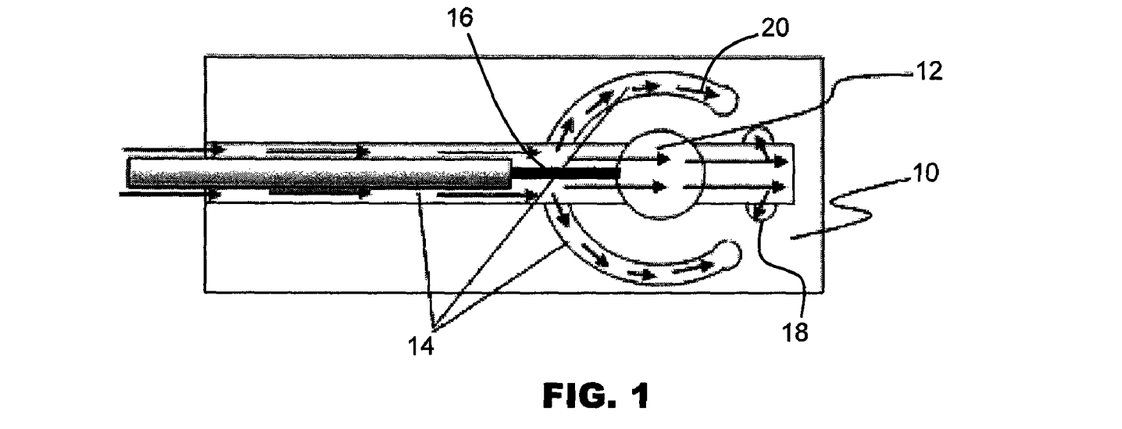
FIG. 1 is a sectional plan view of a gas supplying apparatus according to a first preferred embodiment of the invention illustrating its internal gas channels for providing shielding gas during wire bonding of an electronic device.

FIG. 1 is a sectional plan view of a gas supplying apparatus according to a first preferred embodiment of the invention illustrating its internal gas channels 14 for providing shielding gas during wire bonding of an electronic device. The gas supplying apparatus comprises a main body 10 having a through-hole 12 passing centrally through the main body, to which is connected a gas inlet which may be in the form of a network of internal gas channels 14. The gas channels 14 are located in the main body 10 and supply an inert gas 20, such as nitrogen gas or a mixture of hydrogen and nitrogen gas, to the region in and around the through-hole 12 and to gas outlets located adjacent to the through-hole 12.

FIG. 1 shows the network of gas channels 14 having three separate gas paths, one gas path leading directly to the through-hole 12 and two gas paths at least partially encircling the through-hole 12. Two gas nozzles 18 comprised in the gas outlets are located near or at an end of the main body 10 at an opposite side of the through-hole 12 to where the gas channels 14 are located, and are located on the bottom surface of the main body 10 adjacent to the through-hole 12. Further gas nozzles are preferably located throughout the gas paths that at least partially encircle the through-hole 12. The gas nozzles are connected to the respective gas paths of the gas channels 14. The gas nozzles 18 supply the inert gas 20 externally of the main body 10 and direct the inert gas 20 in a direction towards an electronic device below the main body during wire bonding. An electrode rod 16 is arranged inside a main gas inlet or gas channel 14 and is parallel thereto. The electrode rod 16 terminates close to the through-hole 12.

Figure 2:
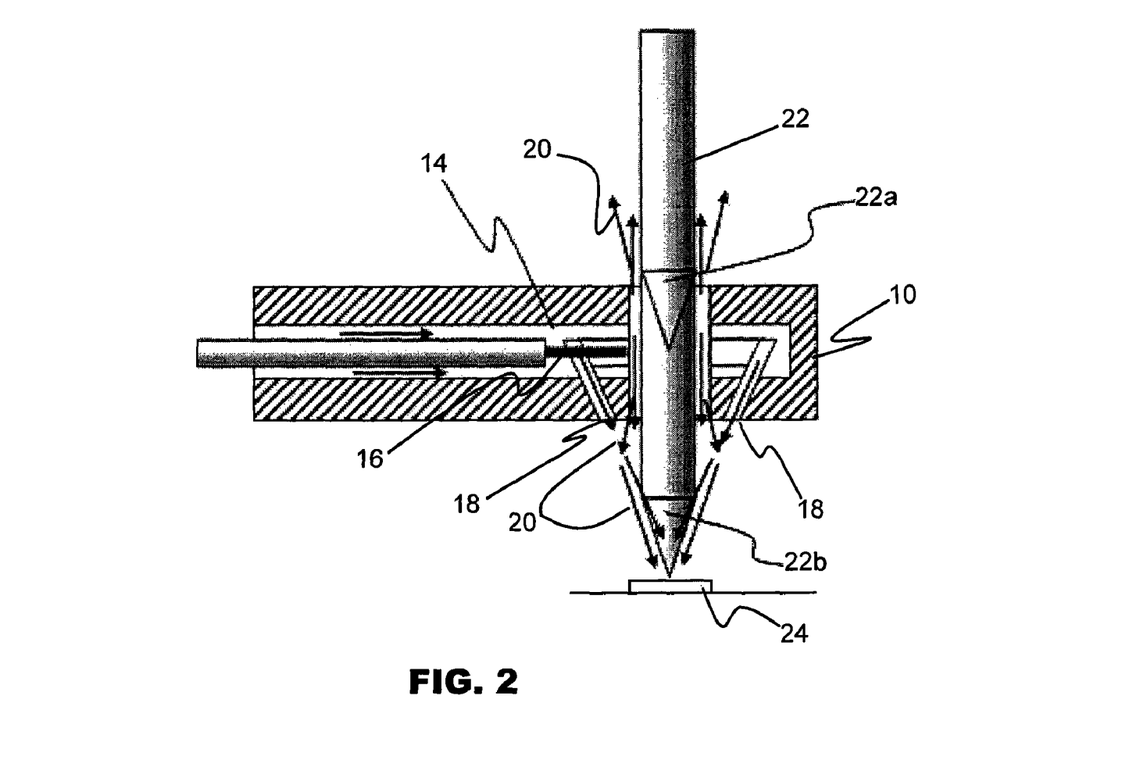
FIG. 2 is a sectional side view of the gas supplying apparatus of FIG. 1 illustrating its internal gas channels and a movement range of a capillary holding bonding wire for sparking and wire bonding.

FIG. 2 is a sectional side view of the gas supplying apparatus of FIG. 1 illustrating its internal gas channels 14 and a movement range of a capillary 22 holding bonding wire (not shown) for sparking and wire bonding. The through-hole 12 is sized such that the tip of the capillary 22 is insertable into the through-hole 12 from one side of the main body 10 to protrude from an opposite side of the main body 10 to conduct wire bonding. The capillary tip has a sparking position 22a where a tail end of the bonding wire hanging from the capillary 22 receives a spark from the electrode rod 16 for melting the bonding wire to form a molten ball. Thereafter, the capillary 22 is movable so that the capillary tip reaches a bonding position 22b where the molten ball is placed onto an electronic device such as a die 24 to form an initial electrical contact or first ball bond between the bonding wire and the die 24.

When the capillary tip is in the sparking position inside the through-hole 12, the capillary tip primarily receives inert gas 20 which is introduced from the gas channels 14 and fed into the through-hole 12 to protect the bonding wire from oxidation during sparking. As illustrated in FIG. 2, the inert gas 20 is channeled in the through-hole 12 towards top and bottom surfaces of the main body 10 so that the tip of the capillary 22 is protected by the inert gas 20 throughout its range of movement within the through-hole 12.

Inert gas 20 introduced from the gas channels 14 is also fed to the nozzles 18 located at the bottom surface of the main body 10. The nozzles 18 direct the inert gas 20 towards and onto the die 24. Therefore, the tip of the capillary 22 primarily receives the inert gas 20 supplied from the nozzles 18 at its bonding position 22b outside the through-hole so that the inert gas 20 protects the bonding wire from oxidation during wire bonding. Multiple nozzles 18 connected to the gas channels 14 may be formed surrounding the through-hole 12 to increase gas coverage at the tip of the capillary 22 at its bonding position 22b. Hence, the tip of the capillary 22 can be protected by the inert gas 20 even when it is moving from one die to another while the tip of the capillary 22 is protruding from the bottom surface of the main body 10. In prior art gas supplying apparatus, the capillary 22 would be protected by inert gas 20 only when its tip is located inside a main body of the gas supplying apparatus, thereby limiting the degree of anti-oxidation protection provided to the bonding wire.

Figure 3:
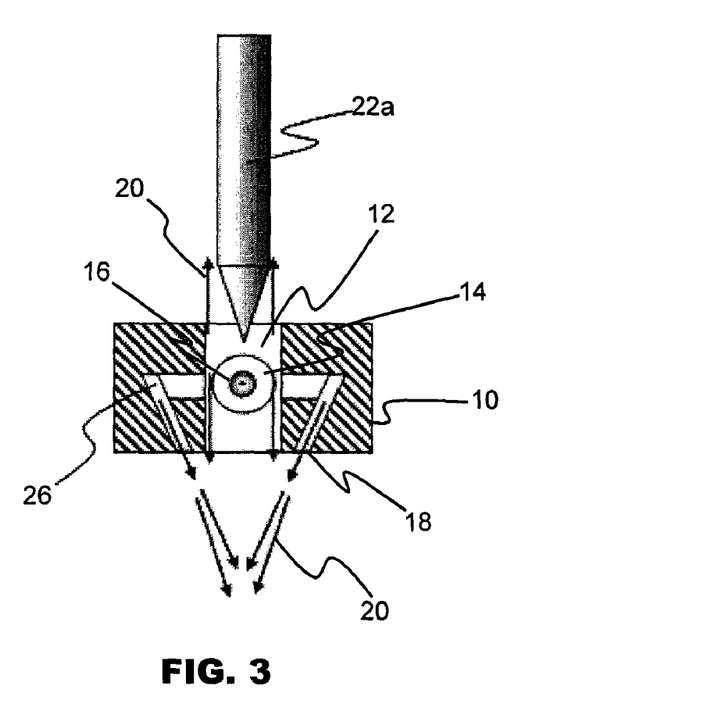
FIG. 3 is a sectional front view of the gas supplying apparatus of FIG. 1 illustrating its internal gas channels.

FIG. 3 is a sectional front view of the gas supplying apparatus of FIG. 1 illustrating its internal gas channels 14. The tip of the capillary 22 is at its sparking position 22a. Inert gas 20 that is introduced from the gas channels 14 flows into the through-hole 12 and upwards towards the capillary 22 and downwards towards the bottom surface of the main body 10. When the electrode rod 16 generates a spark to melt the bonding wire at the tip of the capillary 22, the bonding wire located in the through-hole 12 is protected from oxidation by the inert gas 20.

Inert gas 20 also flows towards the nozzles 18 at the bottom surface of the main body 10 through connectors such as slots 26 formed in the main body 10 leading from the gas channels 14 to the nozzles 18. When the capillary 22 is lowered towards the die 24, the bonding wire at the tip of the capillary 22 continues to be protected by inert gas 20 ejected from the nozzles 18.

Figure 4:
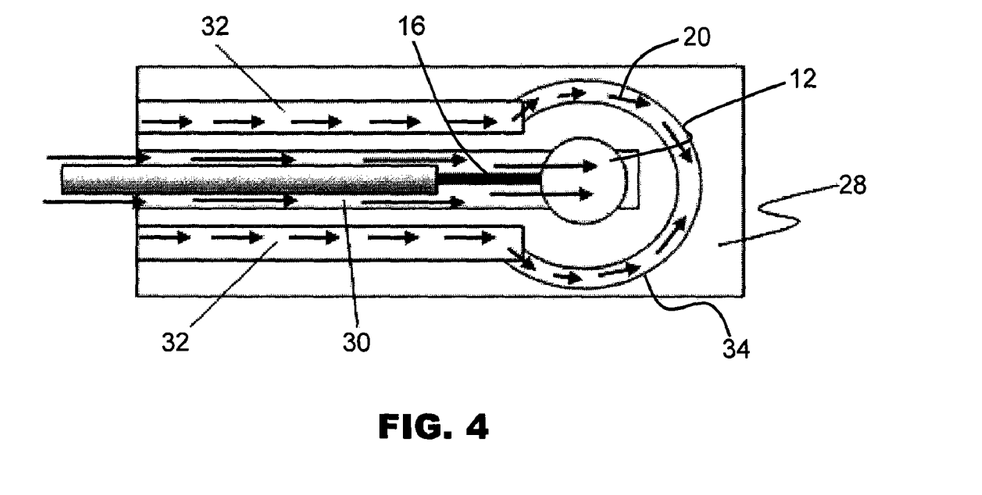
FIG. 4 is a sectional plan view of a gas supplying apparatus according to a second preferred embodiment of the invention having first and second internal gas channels.

FIG. 4 is a sectional plan view of a gas supplying apparatus according to a second preferred embodiment of the invention having first and second internal gas channels 30, 32. Instead of having one network of internal gas channels 14 supplying the inert gas 20, the second embodiment makes use of the first internal gas channel 30 to supply inert gas 20 to the through-hole 12 and the second internal gas channel 32 (which is unconnected to the first internal gas channel 30) to supply inert gas 20 to gas outlets on a shower ring 34 which surrounds the through-hole 12. The supplies of inert gas 20 to the first and second internal gas channels 30, 32 respectively are independently controlled. Therefore, this embodiment has the advantage that there is greater control of the supply of inert gas 20 into the through-hole 12 and towards the die 24 respectively.

Figure 5:
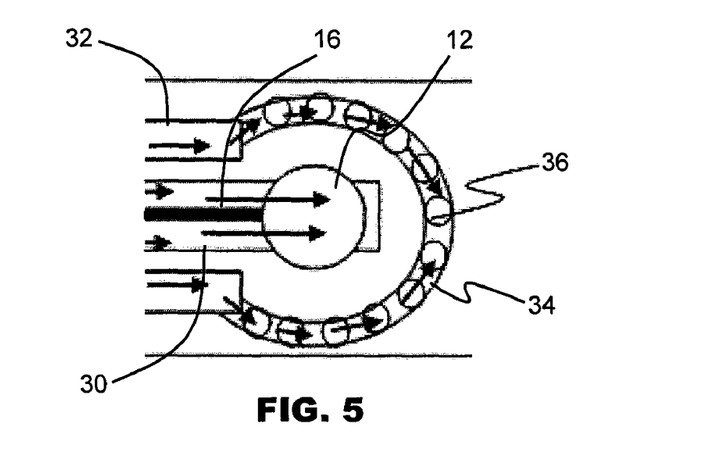
FIG. 5 is a sectional plan view of the gas supplying apparatus of the second preferred embodiment of the invention illustrating gas outlets such as multiple holes along its shower ring.

FIG. 5 is a sectional plan view of the gas supplying apparatus of the second preferred embodiment of the invention illustrating gas outlets such as multiple shower holes 36 along the shower ring 34. The shower holes 36 are located on the bottom surface of the main body 28 to receive inert gas 20 from the shower ring 34 and to eject the inert gas 20 towards the die 24 underneath the main body 28. Increasing the number of shower holes 36 will serve to allow a greater discharge of inert gas 20 towards the tip of the capillary 22 when it is outside the through-hole 12 and to provide greater protection against oxidation of the bonding wire. Alternatively, the gas outlets along the shower ring 34 may be in the form of elongated slots on the bottom surface of the main body 28.

Figure 6:
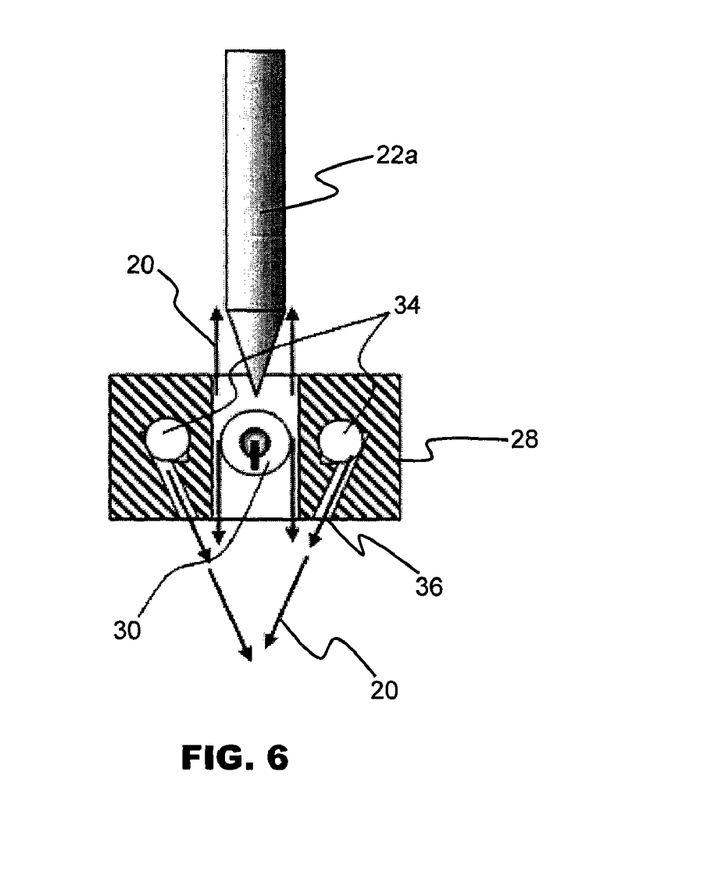
FIG. 6 is a sectional front view of the gas supplying apparatus of FIG. 5 illustrating its internal gas channels.

FIG. 6 is a sectional front view of the gas supplying apparatus of FIG. 5 illustrating its internal gas channels 30, 32. The tip of the capillary 22 is at its sparking position 22a. Inert gas 20 that is introduced from the internal gas channel 30 flows into the through-hole 12 and upwards towards the capillary 22 and downwards towards the bottom surface of the main body 28. When the electrode rod 16 generates a spark to melt the bonding wire at the tip of the capillary 22, the bonding wire located in the through-hole 12 is protected from oxidation by the inert gas 20.

Inert gas 20 also flows towards the shower holes 36 at the bottom surface of the main body 28 via the shower ring 34 which is formed inside the main body 28. The shower ring 34 receives its supply of inert gas 20 from the second internal gas channel 32. When the capillary 22 is lowered towards the die 24, the bonding wire at the tip of the capillary 22 continues to be protected by the shower of inert gas 20 ejected from the shower holes 36.

Figure 7:
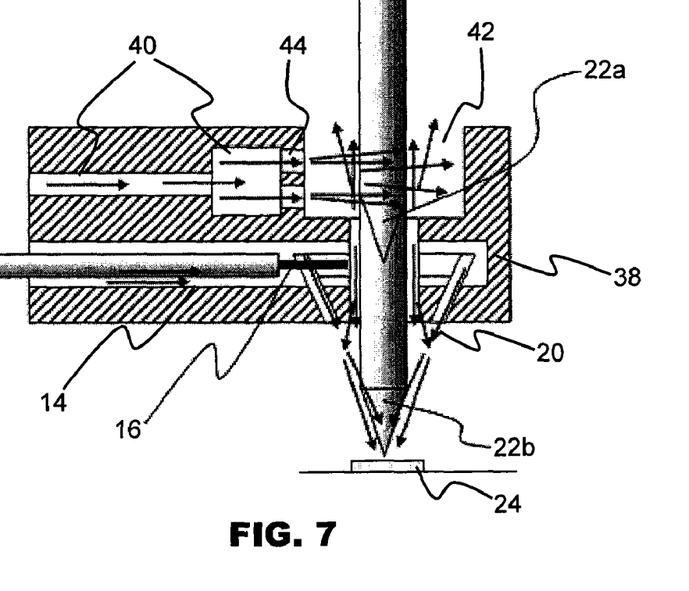
FIG. 7 is a sectional side view of a gas supplying apparatus according to a third preferred embodiment of the invention illustrating its internal gas channels.

FIG. 7 is a sectional side view of a gas supplying apparatus according to a third preferred embodiment of the invention illustrating its internal gas channels. In addition to the gas channels 14 which are also found in the first preferred embodiment of the invention, there is a secondary gas conduit 40 formed in the main body 38 just above the gas channels 14 and which is also connected to the through-hole 12. The secondary gas conduit 40 increases the supply of inert gas 20 towards the through-hole 12 by feeding inert gas 20 to a gas well 42 connected to the secondary gas conduit 40 through secondary nozzles 44. The gas well 42 is located just on top of the through-hole 12. The gas well 42 has a larger cross-sectional area than the through-hole 12, and provides a reservoir of inert gas 20 surrounding the tip of the capillary 22 at its sparking position to increase protection of the bonding wire against oxidation during sparking.

Figure 8:
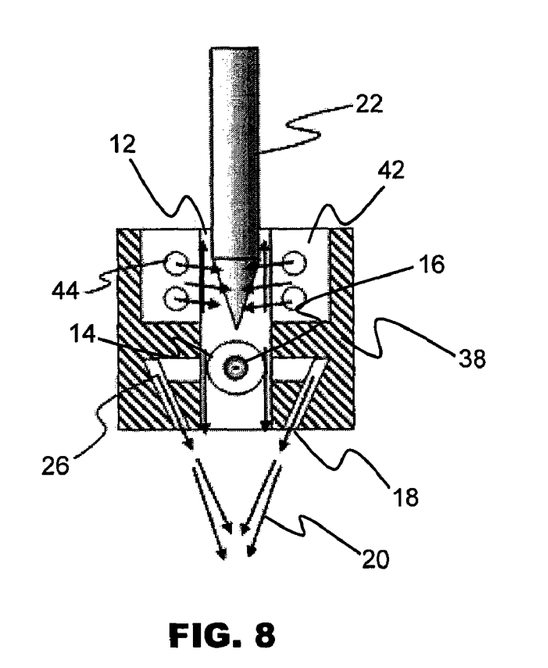
FIG. 8 is a sectional front view of the gas supplying apparatus of FIG. 7 illustrating its internal gas channels.

FIG. 8 is a sectional front view of the gas supplying apparatus of FIG. 7 illustrating its internal gas channels. This view shows the gas well 42 located on top of the through-hole 12 and the gas channels 14. The secondary nozzles 44 provide inert gas 20 to the gas well 42 which contains a reservoir of inert gas 20 to protect the bonding wire from oxidation during sparking. The additional supplement of inert gas 20 from the secondary nozzles 44 to the gas well 42 aids in preventing the loss of gas coverage, especially during sideways movement of the capillary 22 to different bonding locations, during which more inert gas 20 is generally lost to the surroundings. This further ensures that the quality of the bonding wire under the tip of the capillary 22 is maintained during such sideways movement. Increased protection of the bonding wire from oxidation during sparking can thereby be achieved.

Figure 9:
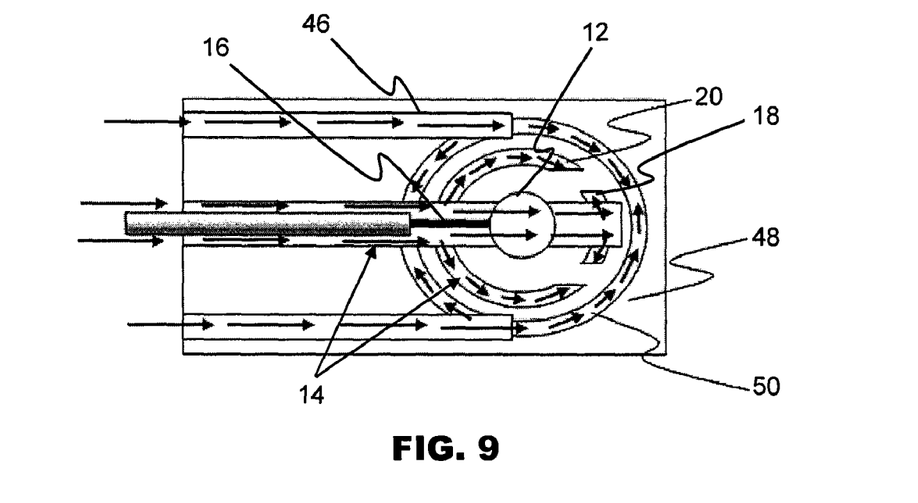
FIG. 9 is a sectional plan view of a gas supplying apparatus according to a fourth preferred embodiment of the invention which includes an outer ring.

FIG. 9 is a sectional plan view of a gas supplying apparatus according to a fourth preferred embodiment of the invention which includes an outer ring 50. The outer ring 50 may be formed in a main body 48 of the gas supply apparatus next to the network of internal gas channels 14 as described in the previous embodiments. The outer ring 50 forms a circular gas path that substantially surrounds the internal gas channels 14 and the through-hole 12. The outer ring 50 may include an outer ring outlet 52 comprising a single uninterrupted slot which communicates with the atmosphere adjacent to the main body 48. Alternatively, the outer ring outlet 52 may comprise multiple holes, nozzles or slots instead of the single uninterrupted slot. The outer ring 50 is connected to a supply of inert gas 20 through outer gas channels 46 which run parallel to the internal gas channels 14 along the main body 48.

Figure 10:
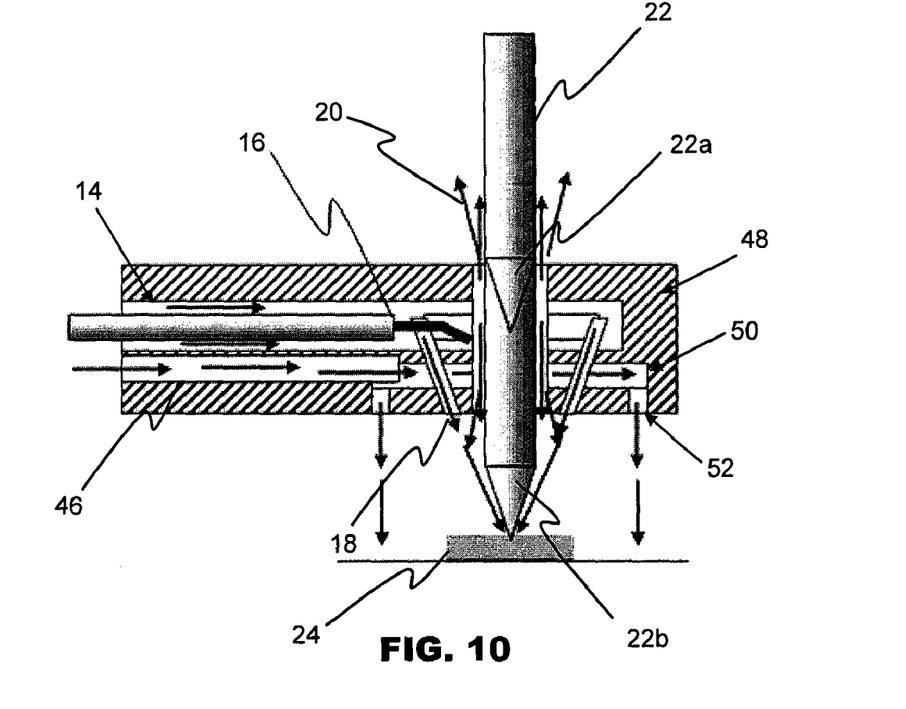
FIG. 10 is a sectional side view of the gas supplying apparatus of FIG. 9 illustrating the outer ring.

FIG. 10 is a sectional side view of the gas supplying apparatus of FIG. 9 illustrating the outer ring 50. The outer ring 50 is spaced from and substantially surrounds the through-hole 12 and gas nozzles 18. The outer ring 50 provides a curtain of inert gas 20 which is emitted from the outer ring outlet 52 at the bottom surface of the main body 48. Therefore, the curtain of inert gas 20 serves to encircle the capillary tip at the bonding position 22b to enhance protection of the bonding wire against oxidation.

Figure 11:
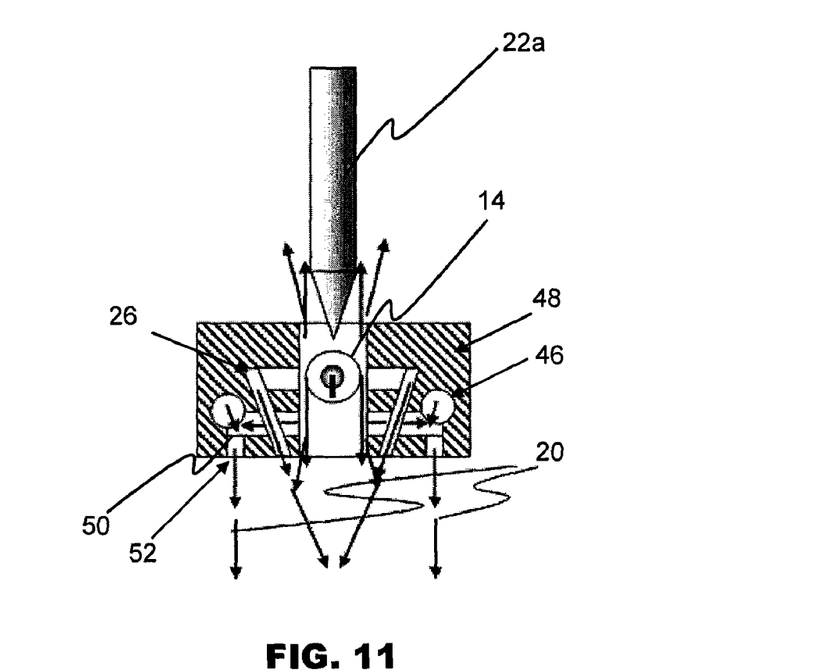
FIG. 11 is a sectional front view of the gas supplying apparatus of FIG. 9 illustrating the outer ring.

FIG. 11 is a sectional front view of the gas supplying apparatus of FIG. 9 illustrating the outer ring 50. This outer ring 50 is preferably located below the internal gas channels 14 and connected to the outer gas channels 46 which supply inert gas 20 to the outer ring 50. The inert gas 20 is projected downwards from the outer ring outlet 52 to form a curtain around the wire bonding area. This curtain forms a shield which inhibits air in the atmosphere from entering the wire bonding area and at the same time helps to reduce the loss of inert gas supplied by the gas channels 14 to the surrounding atmosphere. Loss of coverage of inert gas 20 during sideways movement of the capillary 22 to different bonding locations is also reduced, which assists in maintaining the quality of the bonding wire at the tip of the capillary 22 during such sideways movement.

Figure 12:
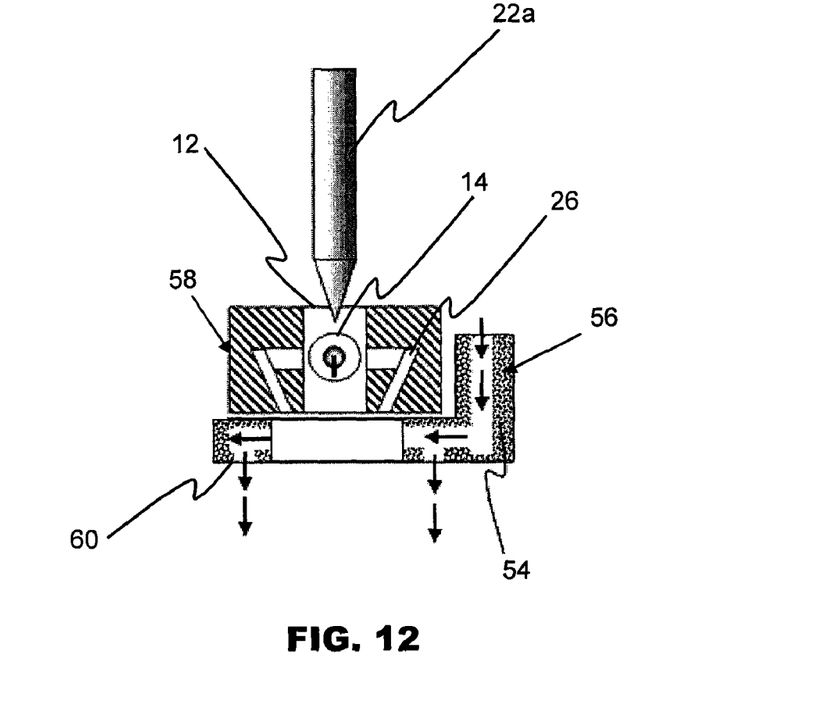
FIG. 12 is a sectional front view of the gas supplying apparatus including a gas tubing which is detachably affixed to a main body.

FIG. 12 is a sectional front view of the gas supplying apparatus including a gas attachment such as a gas tubing 54 which is detachably affixed to a main body 58. Unlike the gas supplying apparatus as described in FIGS. 9-11 wherein the outer ring 50 is formed inside the main body 48, the gas tubing 54 which has an outer ring is detachably affixed to the bottom of the main body 58. The outer ring of the gas tubing encircles the through-hole 12 and gas nozzles 18. The gas tubing 54 has an opening 60 or multiple holes or slots projecting inert gas 20 downwards from its outer ring to form a curtain around the wire bonding area. The gas tubing 54 receives a supply of inert gas 20 through a connecting tube 56.

It should be appreciated that the gas supplying apparatus according to the preferred embodiments of the invention improve the efficiency of shielding of bonding wire that is made of an oxidizable material by an inert gas 20. Oxidation protection may take place not only during sparking when the bonding wire is located within the main body 10, but also when the tip of the capillary 22 and the bonding wire exits the main body 10 during the time the capillary 22 is making wire connections, and when the capillary 22 moves between different bonding locations. By extending inert gas 20 coverage along the travelling path of the capillary 22, the quality of the ball bonds made to form wire connections with surfaces can generally be improved by greater protection of the bonding wire from oxidation. Moreover, better control of the inert gas flow is possible by introducing multiple gas channels 14, secondary gas conduits 40 and other gas paths.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for delivering shielding gas during wire bonding of an electronic device, the apparatus comprising:
   a main body;
   a through-hole in the main body which is sized for allowing a capillary tip of a bonding tool to be insertable through the main body when performing wire bonding;
   at least one gas inlet for receiving an inert gas into the main body, and at least one gas outlet for discharging the inert gas from the main body, the at least one gas inlet and the at least one gas outlet defining a plurality of gas paths along which the inert gas flows, the plurality of gas paths comprising an inner gas path within the main body extending along the through-hole and an outer gas path external to the main body extending towards the electronic device on which the capillary tip performs wire bonding; and
   a secondary gas conduit formed separately in the main body from the gas inlet and formed on top of the gas inlet for increasing a supply of inert gas towards the top of the through-hole.

2. The apparatus as claimed in claim 1, wherein the inner gas path at least partially surrounds the through-hole.

3. The apparatus as claimed in claim 2, wherein the inner gas path is in the form of a shower ring that encircles the through-hole.

4. The apparatus as claimed in claim 3, further comprising shower holes located on the bottom surface of the main body which are connected to the shower ring for ejecting the inert gas from the shower ring.

5. The apparatus as claimed in claim 2, further comprising gas nozzles located at an end of the main body, the gas nozzles directing the inert gas along the other gas path.

6. The apparatus as claimed in claim 1, wherein the gas outlet comprises an elongated slot formed on the bottom surface of the main body.

7. The apparatus as claimed in claim 1, wherein the at least one gas outlet comprises at least one nozzle formed on the bottom surface of the main body.

8. The apparatus as claimed in claim 1, further comprising an electrode rod for melting a bonding wire at the capillary tip when the capillary tip is positioned at the through-hole in the main body.

9. The apparatus as claimed in claim 1, wherein the capillary tip has a sparking position inside the through-hole where it primarily receives inert gas supplied into the through-hole, and a bonding position outside the through-hole where it primarily receives inert gas supplied from the at least one gas outlet.

10. The apparatus as claimed in claim 1, wherein the gas inlet further comprises a first internal gas channel which supplies inert gas to the through-hole and a second internal gas channel unconnected to the first internal gas channel which supplies inert gas to the gas outlet.

11. The apparatus as claimed in claim 10, wherein a supply of inert gas to the first internal gas channel is controlled independently from a supply of inert gas to the second internal gas channel.

12. The apparatus as claimed in claim 1, including a gas well connected to the secondary gas conduit which is located on top of the through-hole and which has a larger cross-sectional area than the through-hole.

13. The apparatus as claimed in claim 1, further comprising an outer ring substantially surrounding the through-hole and gas outlet, which is operative to generate a curtain of inert gas that substantially surrounds the capillary tip.

14. The apparatus as claimed in claim 13, wherein the outer ring includes a single uninterrupted slot on the bottom surface of the main body through which inert gas is expelled to generate the curtain of inert gas outside the main body.

15. The apparatus as claimed in claim 13, wherein the outer ring includes a plurality of nozzles or slots on the bottom surface of the main body through which inert gas is expelled to generate the curtain of inert gas outside the main body.

16. The apparatus as claimed in claim 13, wherein the outer ring is formed in the main body.

17. The apparatus as claimed in claim 13, wherein the outer ring is formed in a gas attachment that is detachably affixed to the main body.

* * * * *